US006202033B1

(12) United States Patent
Lange

(10) Patent No.: US 6,202,033 B1
(45) Date of Patent: Mar. 13, 2001

(54) METHOD FOR ADAPTIVE KALMAN FILTERING IN DYNAMIC SYSTEMS

(76) Inventor: Antti A. Lange, Lisankatu 15 A10, Helsinki 00170 (FI)

( * ) Notice: Subject to any disclaimer, the term of this patent is extended or adjusted under 35 U.S.C. 154(b) by 0 days.

(21) Appl. No.: 09/074,933

(22) PCT Filed: Nov. 15, 1996

(86) PCT No.: PCT/FI96/00621

§ 371 Date: May 15, 1998

§ 102(e) Date: May 15, 1998

(87) PCT Pub. No.: WO97/18442

PCT Pub. Date: May 22, 1997

(30) Foreign Application Priority Data

Nov. 15, 1995 (FI) ........................................................ 955489

(51) Int. Cl.$^7$ .................................................. G01D 18/00

(52) U.S. Cl. ............................................. 702/104; 702/196
(58) Field of Search ..................................... 702/104, 189, 702/190, 191, 196; 708/300

(56) References Cited

U.S. PATENT DOCUMENTS

| 5,506,794 | * | 4/1996 | Lange ............................. | 364/571.01 |
| 5,654,907 | * | 8/1997 | Lange ............................. | 364/571.04 |
| 5,991,525 | * | 11/1999 | Shah et al. ...................... | 395/500.23 |

OTHER PUBLICATIONS

Lange, Antti A. I. (1998): "Information Disclosure Statement of Aug. 15, 1988".
Kalman, R. E. (1960) : "A new approach to linear filtering and prediction problems". Trans. ASME J. of Basic Eng. 82:35–45.

Lange, A. A. (1982): "Multipath propagation of VLF Omega signals". IEEE Plans '82—Position Location and Navigation Symposium Record, Dec. 1982, 302–309.

Lange, A. A. (1984): "Integration, calibration and intercomparison of windfinding devices". WMO Instruments and Observing Methods Report No. 15.

Lange, A. A. (1988a): "A high–pass filterr for optimum calibration of observing systems with applications". Simulation and Optimization of Large Systems, edited by A. J. Osiadacz, Oxford University Press/Clarendon Press, Oxford, 1988, 311–327.

Lange, A. A. (1988b): "Determination of the radiosonde biases by using satellite radiance measurements". WMO Instruments and Observing Methods Report No. 33, 201–206.

Lange, A. A. (1994): "A surface–based hybrid upper–air sounding system". WMO Instruments and Observing Methods Report No. 57, 175–177.

(List continued on next page.)

Primary Examiner—Patrick Assouad

(57) ABSTRACT

The invention is based on the use of the principles of Lange's Fast Kalman-Filtering (FKF™) for large process control, prediction or warning systems where other computing methods are either too slow or fail because of truncation errors. The invented method makes it possible to exploit the FKF method for adaptive Kalman Filtering of dynamic multiparameter systems with large moving data-windows.

1 Claim, 1 Drawing Sheet

OTHER PUBLICATIONS

Ray, R. D. (1995): "ACM/TOMS Algorithm 741: Least Squares Solution of a Linear Bordered, Block–diagonal System of Equations". ACM Trans. Math. Softw., 221, No. 1, 20–25.

Simmons, A. (1995): quotation: ". . .the basic approach of Kalman Filtering is well established theoretically, but the computational requirement renders a full implementation intractable . . .", ECMWF Newsletter No. 69, Spring 1995, p. 12.

Cotton, Thompson & Mielke, 1994: "Real–Time Mesoscale Prediction on Workstations", Bulletin of the American Meteorological Society, vol. 75, No. 3, Mar. 1994, pp. 349–362.

Brockmann, E. (1997): "Combination of Solutions for Geodetic and Geodynamic Applications of the Global Positioning System (GPS)". published in: Geodätisch—geophysikalische Arbeiten in der Schweiz, vol. 55, Schweitzerische Geodätische Kommission, see pp. 22–23.

* cited by examiner

METHOD FOR ADAPTIVE KALMAN FILTERING IN DYNAMIC SYSTEMS

TECHNICAL FIELD

This invention relates generally to all practical applications of Kalman filtering and more particularly to controlling dynamic systems with a need for fast and reliable adaptation to circumstances.

BACKGROUND ART

Prior to explaining the invention, it is helpful to understand first the prior art of conventional Kalman recursions as well as the Fast Kalman Filtering (FKF) method for both calibrating a sensor system PCT/FI90/00122 (WO 90/13794) and controlling a large dynamic system PCT/FI93/00192 (WO 93/22625).

The underlying Markov (finite memory) process is described by the equations from (1) to (3). The first equation tells how a measurement vector $y_t$ depends on a state vector $s_t$ at time point t, (t=0,1,2 . . . ). This is the linearized Measurement (or observation) equation:

$$y_t = H_t s_t + e_t \qquad (1)$$

Matrix $H_t$ is the design (Jacobian) matrix that stems from the partial derivatives of actual physical dependencies. The second equation describes the time evolution of the overall system and it is known as the linearized System (or state) equation:

$$s_t = A_t s_{t-1} + B_t u_{t-1} + a_t \qquad (2)$$

Matrix $A_t$ is the state transition (Jacobian) matrix and $B_t$ is the control gain (Jacobian) matrix. Equation (2) tells how present state $s_t$ of the overall system develops from previous state $s_{t-1}$, control/external forcing $u_{t-1}$ and random error $a_t$ effects. When measurement errors $e_t$ and system errors $a_t$ are neither auto- (i.e. white noise) nor cross-correlated and are given by the following covariance matrices:

$$Q_t = \text{Cov}(a_t) = E(a_t a_t')$$

and $$R_t = \text{Cov}(e_t) = E(e_t e_t') \qquad (3)$$

then the famous Kalman forward recursion formulae from (4) to (6) give us Best Linear Unbiased Estimate (BLUE) $\hat{s}_t$ of present state $s_t$ as follows:

$$\hat{s}_t = A_t \hat{s}_{t-1} + B_t u_{t-1} + K_t \{y_t - H_t(A_t \hat{s}_{t-1} + B_t u_{t-1})\} \qquad (4)$$

and the covariance matrix of its estimation errors as follows:

$$\hat{P}_t = \text{Cov}(\hat{s}_t) = E\{(\hat{s}_t - s_t)(\hat{s}_t - s_t)'\} = A_t \hat{P}_{t-1} A_t' + Q_t - K_t H_t (A_t \hat{P}_{t-1} A_t' + Q_t) \qquad (5)$$

where the Kalman gain matrix $K_t$ is defined by $$K_t = (A_t \hat{P}_{t-1} A_t' + Q_t) H_t' \{H_t (A_t \hat{P}_{t-1} A_t' + Q_t) H_t' + R_t\}^{-1} \qquad (6)$$

This recursive linear solution is (locally) optimal. The stability of the Kalman Filter (KF) requires that the observability and controlability conditions must also be satisfied (Kalman, 1960). However, equation (6) too often requires an overly large matrix to be inverted. Number n of the rows (and columns) of the matrix is as large as there are elements in measurement vector $y_t$. A large n is needed for making the observability and controlability conditions satisfied. This is the problem sorted out by the discoveries reported here and in PCT/FI90/00122 and PCT/FI93/00192.

The following modified form of the State equation has been introduced $$A_t \hat{s}_{t-1} + B_t u_{t-1} = I s_t + A_t(\hat{s}_{t-1} - s_{t-1}) - a_t \qquad (7)$$

and combined with the Measurement equation (1) in order to obtain the so-called Augmented Model:

$$\begin{bmatrix} y_t \\ A_t \hat{s}_{t-1} + B_t u_{t-1} \end{bmatrix} = \begin{bmatrix} H_t \\ I \end{bmatrix} s_t + \begin{bmatrix} e_t \\ A_t(\hat{s}_{t-1} - s_{t-1}) - a_t \end{bmatrix} \qquad (8)$$

i.e. $z_t = Z_t s_t + \eta_t$

The state parameters can be estimated by using the well-known solution of a Regression Analysis problem as follows:

$$\hat{s}_t = (Z_t' V_t^{-1} Z_t)^{-1} Z_t' V_t^{-1} z_t \qquad (9)$$

The result is algebraically equivalent to use of the Kalman recursions but not numerically (see e.g. Harvey, 1981: "Time Series Models", Philip Allan Publishers Ltd, Oxford, UK, pp. 101–119). The dimension of the matrix to be inverted in equation (9) is now the number (=m) of elements in state vector $s_t$. Harvey's approach is fundamental to all different variations of the Fast Kalman Filtering (FKF) method.

An initialization or temporary training of any large Kalman Filter (KF), in order to make the observability condition satisfied, can be done by Lange's High-pass Filter (Lange, 1988). It exploits an analytical sparse-matrix inversion formula for solving regression models with the following so-called Canonical Block-angular matrix structure:

$$\begin{bmatrix} y_1 \\ y_2 \\ \vdots \\ y_K \end{bmatrix} = \begin{bmatrix} X_1 & & & G_1 \\ & X_2 & & G_2 \\ & & \ddots & \vdots \\ & & & X_K \ G_K \end{bmatrix} \begin{bmatrix} b_1 \\ \vdots \\ b_K \\ c \end{bmatrix} + \begin{bmatrix} e_1 \\ e_2 \\ \vdots \\ e_K \end{bmatrix} \qquad (10)$$

This is the matrix representation of the Measurement equation of e.g. an entire windfinding intercomparison experiment. The vectors $b_1, b_2, \ldots, b_K$ typically refer to consecutive position coordinates e.g. of a weather balloon but may also contain those calibration parameters that have a significant time or space variation. The vector c refers to the other calibration parameters that are constant over the sampling period.

For all large multiple sensor systems their design matrices $H_t$ are sparse. Thus, one can do in one way or another the same sort of $$\text{Partitioning } s_t = \begin{bmatrix} b_{t,1} \\ \vdots \\ b_{t,K} \\ c_t \end{bmatrix} \ y_t = \begin{bmatrix} y_{t,1} \\ y_{t,2} \\ \vdots \\ y_{t,K} \end{bmatrix} \ H_t = \begin{bmatrix} X_{t,1} & & & G_{t,1} \\ & X_{t,2} & & G_{t,2} \\ & & \ddots & \vdots \\ & & & X_{t,K} \ G_{t,K} \end{bmatrix} \qquad (11)$$

$$A = \begin{bmatrix} A_1 & & & \\ & \ddots & & \\ & & A_K & \\ & & & A_c \end{bmatrix} \text{ and, } B = \begin{bmatrix} B_1 & & & \\ & \ddots & & \\ & & B_K & \\ & & & B_c \end{bmatrix}$$

where $c_t$ typically represents calibration parameters at time t $b_{t,k}$ all other state parameters in the time and/or space volume A state transition matrix (block-diagonal) at time t B matrix (block-diagonal) for state-independent effects $u_t$ at time t.

If the partitioning is not obvious one may try to do it automatically by using a specific algorithm that converts every sparse linear system into the Canonical Block-angular form (Weil and Kettler, 1971: "Rearranging Matrices to Block-angular Form for Decomposition (and other) Algorithms", Management Science, Vol. 18, No. 1, Semptember 1971, pages 98–107). The covariance matrix of random errors $e_t$ may, however, loose something of its original and simple diagonality.

Consequently, gigantic Regression Analysis problems were faced as follows:

Augmented Model for a space volume case: e.g. for the data of a balloon tracking experiment with K consecutive balloon positions:

$$\begin{bmatrix} y_{t,1} \\ A_1\hat{b}_{t-1,1}+B_1u_{b_{t-1,1}} \\ y_{t,2} \\ A_2\hat{b}_{t-1,2}+B_2u_{b_{t-1,2}} \\ \vdots \\ y_{t,K} \\ A_K\hat{b}_{t-1,K}+B_Ku_{b_{t-1,K}} \\ A_c\hat{c}_{t-1}+B_cu_{c_{t-1}} \end{bmatrix} = \begin{bmatrix} X_{t,1} & & & & G_{t,1} \\ I & & & & \\ & X_{t,2} & & & G_{t,2} \\ & I & & & \\ & & \ddots & & \vdots \\ & & & X_{t,K} & G_{t,K} \\ & & & I & \\ & & & & I \end{bmatrix} \begin{bmatrix} b_{t,1} \\ b_{t,2} \\ \vdots \\ b_{t,K} \\ c_t \end{bmatrix} + \begin{bmatrix} e_{t,1} \\ A_1(\hat{b}_{t-1,1}-b_{t-1,1})-a_{b_{t,1}} \\ e_{t,2} \\ A_2(\hat{b}_{t-1,2}-b_{t-1,2})-a_{b_{t,2}} \\ \vdots \\ e_{t,K} \\ A_K(\hat{b}_{t-1,K}-b_{t-1,K})-a_{b_{t,K}} \\ A_c(\hat{c}_{t-1}-c_{t-1})-a_{c_t} \end{bmatrix}$$

Augmented Model for a moving time volume: (e.g. for "whitening" an observed "innovations" sequence of residuals $e_t$ for a moving sample of length L):

$$\begin{bmatrix} y_t \\ A\hat{s}_{t-1}+Bu_{t-1} \\ y_{t-1} \\ A\hat{s}_{t-2}+Bu_{t-2} \\ \vdots \\ y_{t-L+1} \\ A\hat{s}_{t-L}+Bu_{t-L} \\ A\hat{C}_{t-1}+Bu_{c_{t-1}} \end{bmatrix} = \begin{bmatrix} H_t & & & & F_t \\ I & & & & \\ & H_{t-1} & & & F_{t-1} \\ & I & & & \\ & & \ddots & & \vdots \\ & & & H_{t-L+1} & F_{t-L+1} \\ & & & I & \\ & & & & I \end{bmatrix} \begin{bmatrix} s_t \\ s_{t-1} \\ \vdots \\ s_{t-L+1} \\ c_t \end{bmatrix} + \begin{bmatrix} e_t \\ A(\hat{s}_{t-1}-s_{t-1})-a_t \\ e_{t-1} \\ A(\hat{s}_{t-2}-s_{t-2})-a_{t-1} \\ \vdots \\ e_{t-L+1} \\ A(\hat{s}_{t-L}-s_{t-L})-a_{t-L+1} \\ A(\hat{C}_{t-1}-C_{t-1})-a_{c_t} \end{bmatrix}$$

Please note that the latter matrix equation has a "nested" Block-Angular structure. There are two types of "calibration" parameters $c_t$ and $C_t$. The first set of these parameters, $c_t$, can vary from one time to another. The second type, $C_t$, of these parameters have constant values (approximately at least) over long moving time windows of length L. The latter ones, $C_t$, make the Kalman filtering process an adaptive one. The solving of the latter parameters with the conventional Kalman recursions from (4) to (6) causes an observability problem as for computational reasons length L must be short. But with the FKF formulae of PCT/FI90/00122, the sample size can be so large that no initialization (or training) may be needed at all.

Prior to explaining the method of PCT/FI93/00192, it will be helpful to first understand some prior art of the Kalman Filtering (KF) theory exploited in experimental Numerical Weather Prediction (NWP) systems. As previously, they also make use of equation (1):

Measurement Equation: $y_t = H_t s_t + e_t$ (linearized regression)

where state vector $s_t$ describes the state of the atmosphere at time t. Now, $s_t$ usually represents all gridpoint values of atmospheric variables e.g. the geopotential heights (actually, their departure values from the actual values estimated by some means) of different pressure levels.

The dynamics of the atmosphere is governed by a well-known set of partial differential equations ("primitive" equations). By using e.g. the tangent linear approximation of the NWP model the following expression of equation (2) is obtained for the time evolution of state parameters $s_t$ (actually, their departure values from a "trajectory" in the space of state parameters generated with the nonlinear NWP model) at a time step:

State Equation: $s_t = A s_{t-1} + B u_{t-1} + a_t$ (the discretized dyn-stoch.model)

The four-dimensional data assimilation results ($\hat{s}_t$) and the NWP forecasts ($\tilde{s}_t$) respectively, are obtained from the Kalman Filter system as follows:

$\hat{s}_t = \tilde{s}_t + K_t(y_t - H_t\tilde{s}_t)$ $\tilde{s}_t = A\hat{s}_{t-1} + Bu_{t-1}$ (12)

where $P_t = \text{Cov}(\tilde{s}_t) = A\,\text{Cov}(\hat{s}_{t-1})A' + Q_t$ (prediction accuracy)

$Q_t = \text{Cov}(a_t) = E a_t a'_t$ (system noise)

$R_t = \text{Cov}(e_t) = E e_t e'_t$ (measurement noise)

and the crucial Updating computations are performed with the following Kalman Recursion:

$K_t = P_t H'_t (H_t P_t H'_t + R_t)^{-1}$ (Kalman Gain matrix)

$\text{Cov}(\hat{s}_t) = P_t - K_t H_t P_t$ (estimation accuracy).

The matrix inversion needed here for the computation of the Kalman Gain matrix is overwhelmingly difficult to compute for a real NWP system because the data assimilation system must be be able to digest several million data elements at a time. Dr. T. Gal-Chen reported on this problem in 1988 as follows: "There is hope that the developments of massively parallel supercomputers (e.g., 1000 desktop CRAYs working in tandem) could result in algorithms much closer to optimal . . . ", see "Report of the Critical Review Panel—Lower Tropospheric Profiling Symposium: Needs and Technologies", Bulletin of the American Meteorological Society, Vol. 71, No. 5, May 1990, page 684.

The method of PCT/FI93/00192 exploits the Augmented Model approach from equation (8):

$$\begin{bmatrix} y_t \\ A\hat{s}_{t-1} + Bu_{t-1} \end{bmatrix} = \begin{bmatrix} H_t \\ I \end{bmatrix} s_t + \begin{bmatrix} e_t \\ A(\hat{s}_{t-1} - s_{t-1}) - a_t \end{bmatrix} \quad (15)$$

i.e. $z_t = Z_t s_t + \eta_t$

The following two sets of equations are obtained for Updating purposes:

$$\hat{s}_t = (Z_t' V_t^{-1} Z_t)^{-1} Z_t' V_t^{-1} z_t \quad \text{...(optimal estimation by Gauss-Markov)} \quad (13)$$
$$= \{H_t' R_t^{-1} H_t + P_t^{-1}\}^{-1} (H_t' R_t^{-1} y_t + P_t^{-1} \tilde{s}_t) \text{ or,}$$
$$= \tilde{s}_t + K_t(y_t - H_t \tilde{s}_t) \text{ ...(alternatively) and,}$$

$$Cov(\hat{s}_t) = E(\hat{s}_t - s_t)(\hat{s}_t - s_t)' = (Z_t' V_t^{-1} Z_t)^{-1} \quad (14)$$
$$= \{H_t' R_t^{-1} H_t + P_t^{-1}\}^{-1} \text{ ... (estimation accuracy)}$$

where, $$\tilde{s}_t = A\hat{s}_{t-1} + Bu_{t-1} \quad \text{(NWP "forecasting")}$$

$$P_t = Cov(\tilde{s}_t) = A \; Cov(\hat{s}_{t-1})A' + Q_t \quad (15)$$

but instead of $$K_t = P_t H_t'(H_t P_t H_t' + R_t) \quad \text{(Kalman Gain matrix)}$$

the FKF method of PCT/FI93/00192 takes $$K_t = Cov(\hat{s}_t) H_t' R_t^{-1} \quad (16)$$

The Augmented Model approach is superior to the use of the conventional Kalman recursions for a large vector of input data $y_t$ because the computation of the Kalman Gain matrix $K_t$ requires the huge matrix inversion when $Cov(\hat{s}_t)$ is unknown. Both methods are algebraically and statistically equivalent but certainly not numerically.

However, the Augmented Model formulae are still too difficult to be handled numerically. This is, firstly, because state vector $s_t$ consists a large amount (=m) of gridpoint data for a realistic representation of the atmosphere. Secondly, there are many other state parameters that must be included in the state vector for a realistic NWP system. These are first of all related to systematic (calibration) errors of observing systems as well as to the so-called physical parameterization schemes of small scale atmospheric processes.

The calibration problems are overcome in PCT/FI93/00192 by using the method of decoupling states. It is done by performing the following Partitioning:

$$s_t = \begin{bmatrix} b_{t,1} \\ \vdots \\ b_{t,K} \\ c_t \end{bmatrix} y_t = \begin{bmatrix} y_{t,1} \\ t_{t,2} \\ \vdots \\ y_{t,K} \end{bmatrix} H_t = \begin{bmatrix} X_{t,1} & & & G_{t,1} \\ & X_{t,2} & & G_{t,2} \\ & & \ddots & \vdots \\ & & & X_{t,K} & G_{t,K} \end{bmatrix} \quad (17)$$

and $$A_t = \begin{bmatrix} A_{t,1} \\ \vdots \\ A_{t,K} \\ A_{t,c} \end{bmatrix} \text{ and, } B_t = \begin{bmatrix} B_{t,1} \\ \vdots \\ B_{t,K} \\ B_{t,c} \end{bmatrix}$$

where $c_t$ typically represents "calibration" parameters at time t $b_{t,k}$ values of atmospheric parameters at gridpoint k (k=1, . . . K)

A state transition matrix at time t (submatrices $A_1, \ldots, A_K, A_c$)

B control gain matrix (submatrices $B_1, \ldots, B_K, B_c$).

Consequently, the following gigantic Regression Analysis problem was faced:

$$\begin{bmatrix} y_{t,1} \\ A_1\hat{s}_{t-1} + B_1 u_{t-1} \\ y_{t,2} \\ A_2\hat{s}_{t-1} + B_2 u_{t-1} \\ \vdots \\ y_{t,K} \\ A_K\hat{s}_{t-1} + B_K u_{t-1} \\ A_c\hat{s}_{t-1} + B_c u_{t-1} \end{bmatrix} = \begin{bmatrix} X_{t-1} & & & & G_{t,1} \\ I & & & & \\ & X_{t,2} & & & G_{t,2} \\ & I & & & \\ & & \ddots & & \vdots \\ & & & X_{t,K} & G_{t,K} \\ & & & I & \\ & & & & I \end{bmatrix} \begin{bmatrix} b_{t,1} \\ b_{t,2} \\ \vdots \\ b_{t,K} \\ c_t \end{bmatrix} + \begin{bmatrix} e_{t,1} \\ A_1(\hat{s}_{t-1} - s_{t-1}) - a_{b_{t,1}} \\ e_{t,2} \\ A_2(\hat{s}_{t-1} - s_{t-1}) - a_{b_{t,2}} \\ \vdots \\ e_{t,K} \\ A_K(\hat{s}_{t-1} - s_{t-1}) - a_{b_{t,K}} \\ A_c(\hat{s}_{t-1} - s_{t-1}) - a_{c_t} \end{bmatrix} \quad (18)$$

The Fast Kalman Filter (FKF) formulae for the recursion step at any time point t were as follows:

$$\hat{b}_{t,k} = \{X_{t,k}' V_{t,k}^{-1} X_{t,k}\}^{-1} X_{t,k}' V_{t,k}'(y_{t,k} - G_{t,k}\hat{c}_t) \text{ for } k = 1, 2, \ldots, K \quad (19)$$

$$\hat{c}_t = \left\{ \sum_{k=0}^{K} G_{t,k}' R_{t,k} G_{t,k} \right\}^{-1} \sum_{k=0}^{K} G_{t,k}' R_{t,k} y_{t,k}$$

where, for k=1,2, . . . ,K, $$R_{t,k} = V_{t,k}^{-1} \{I - X_{t,k} \{X_{t,k}' V_{t,k}^{-1} X_{t,k}\}^{-1} X_{t,k}' V_{t,k}^{-1}\}$$

$$V_{t,k} = \begin{bmatrix} Cov(e_{t,k}) & \\ & Cov\{A_k(\hat{s}_{t-1} - s_{t-1}) - a_{b_{t,k}}\} \end{bmatrix}$$

$$y_{t,k} = \begin{bmatrix} y_{t,k} \\ A_k \hat{s}_{t-1} + B_k u_{t-1} \end{bmatrix}$$

$$X_{t,k} = \begin{bmatrix} X_{t,k} \\ I \end{bmatrix}$$

$$G_{t,k} = \begin{bmatrix} G_{t,k} \\ \_ \end{bmatrix}$$

and, i.e. for k=0, $R_{t,0} = V_{t,0}^{-1}$ $V_{t,0} = Cov\{A_c(\hat{s}_{t-1} - s_{t-1}) - a_{c_t}\}$ $Y_{t,0} = A_c \hat{s}_{t-1} + B_c u_{t-1}$ $G_{t,0} = I$.

The data assimilation accuracies were obtained from equation (20) as follows:

$$Cov(\hat{s}_t) = Cov(\hat{b}_{t,1}, \ldots, \hat{b}_{t,K}, \hat{c}_t) \quad (20)$$

$$= \begin{bmatrix} C_1 + D_1 SD'_1 & D_1 SD'_2 & \ldots & D_1 SD'_K & -D_1 S \\ D_2 SD'_1 & C_2 + D_2 SD'_2 & & D_2 SD'_K & -D_2 S \\ \vdots & & \ddots & & \vdots \\ D_K SD'_1 & D_K SD'_2 & & C_K + D_K SD'_K & -D_K S \\ -SD'_1 & -SD'_2 \ldots & & -SD'_K & S \end{bmatrix}$$

where $C_k = \{X'_{t,k} V_{t,k}^{-1} X_{t,k}\}^{-1}$ for $k = 1, 2, \ldots, K$ $D_k = \{X'_{t,k} V_{t,k}^{-1} X_{t,k}\}^{-1} X'_{t,k} V_{t,k}^{-1} G_{t,k}$ for $k = 1, 2, \ldots, K$ $S = \left\{ \sum_{k=0}^{K} G'_{t,k} R_{t,k} G_{t,k} \right\}^{-1}$ Kalman Filter (KF) studies have also been reported e.g. by Stephen E. Cohn and David F. Parrish (1991): "The Behavior of Forecast Error Covariances for a Kalman Filter in Two Dimensions", Monthly Weather Review of the American Meteorological Society, Vol. 119, pp. 1757–1785. However, the ideal Kalman Filter systems described in all such reports is still out of reach for Four Dimensions (i.e. space and time). A reliable estimation and inversion of the error covariance matrix of the state parameters is required as Dr. Heikki Jarvinen of the European Centre for Medium-range Weather Forecasts (ECMWF) states: "In meteorology, the dimension (=m) of the state parameter vector $s_t$ may be 100,000–10,000,000. This makes it impossible in practice to exactly handle the error covariance matrix.", see "Meteorological Data Assimilation as a Variational Problem", Report No. 43 (1995), Department of Meteorology, University of Helsinki, page 10. Dr. Adrian Simmons of ECMWF confirmes that "the basic approach of Kalman Filtering is well established theoretically, but the computational requirement renders a full implementation intractable.", see ECMWF Newsletter Number 69 (Spring 1995), page 12.

The Fast Kalman Filtering (FKF) formulas known from PCT/FI90/00122 and PCT/FI93/00192 make use of the assumption that error covariance matrix $V_t$ in equations (9) and (13), respectively, is block-diagonal. Please see the FKF formula (19) where these diagonal blocks are written out as:

$$V_{t,k} = \begin{bmatrix} Cov(e_{t,k}) & \\ & Cov\{A_k(\hat{s}_{t-1} - s_{t-1}) - a_{b_{t,k}}\} \end{bmatrix}$$

It is clear especially for the case of adaptive Kalman Filtering (and the 4-dimensional data-assimilation) that the estimates of consecutive state parameter vectors $s_{t-1}$, $s_{t-2}$, $s_{t-3}$, . . . are cross- and auto-correlated.

There exists a need for exploiting the principles of the Fast Kalman Filtering (FKF) method for adaptive Kalman Filtering (AKF) with equal or better computational speed, reliability, accuracy, and cost benefits than other Kalman Filtering methods can do. The invented method for an exact way of handling the error covariances will be disclosed herein.

SUMMARY OF THE INVENTION

These needs are substantially met by provision of the adaptive Fast Kalman Filtering (FKF) method for calibrating/adjusting various parameters of the dynamic system in real-time or in near real-time. Both the measurement and the system errors are whitened and partially orthogonalized as described in this specification. The FKF computations are made as close to the optimal Kalman Filter as needed under the observability and controllability conditions. The estimated error variances and covariances provide a tool for monitoring the filter stability.

BEST MODE FOR CARRYING OUT THE INVENTION

Figure 1:
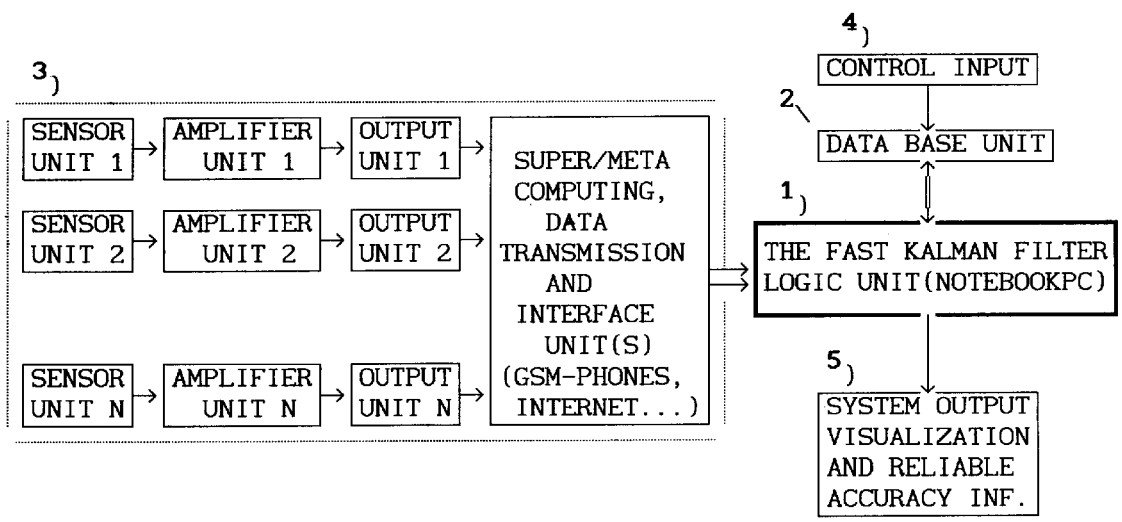
FIG. 1. Diagram of the disclosed invention.

We rewrite the linearized Measurement (or observation) equation:

$$y_t = H_t s_t + F_t^y C_t + e_t \quad (21)$$

where $e_t$ now represents "white" noise that correlates with neither $e_{t-1}$, $e_{t-2}$, . . . nor $\hat{s}_{t-1}$, $\hat{s}_{t-2}$, . . . nor $a_t$, $a_{t-1}$, $a_{t-2}$, . . . Matrix $H_t$ is still the same design matrix as before that stemms from the partial derivatives of the physical dependencies between measurements $y_t$ and state parameters $s_t$, please see Partitioning (11) on page 3 (the old block-diagonality assumption for matrices A and B is no longer valid). Matrix $F_t^y$ describes how the systematic errors of the measurements depend on the calibration or "calibration type" parameters, vector $C_t$, that are constants in time or vary only slowly. The columns of matrices $F_t^y$, $F_{y-1}^y$, $F_{t-2}^y$, . . . represent partial derivatives, wave forms like sinusoids, square waves, "hat" functions, etc. and empirical orthogonal functions (EOF) depending on what is known about physical dependencies, regression and autoregression (AR) of the systematic errors of the measurements. Elements of estimated vector $\hat{C}_t$ will then determine amplitudes of the "red" noise factors. Let us refer to quite similar Augmented Model for a moving time volume for "whitening" observed "innovations" sequences of measurements, on the bottom of page 4.

Similarly, we rewrite the linearized System (or state) equation:

$$s_t = (A_t + dA_t)s_{t-1} + B_t u_{t-1} + F_t^s C_t + a_t \quad (22)$$

where $a_t$ now represents "white" noise that correlates with neither $e_t$, $e_{t-1}$, $e_{t-2}$, . . . nor $\hat{s}_{t-1}$, $\hat{s}_{t-2}$, . . . nor $a_{t-1}$, $a_{t-2}$, . .

. . Matrix $A_t$ is still the same state transition matrix that stemms from the partial derivatives of the physical dependencies between states $s_t$ and previous states $s_{t-1}$. Matrix $F_t^s$ describes how the systematic errors of the dynamical model (e.g. NWP) depend on the calibration or "calibration type" parameters, vector $C_t$, that are constants in time or vary only slowly. The columns of matrices $F_t^s$, $F_{t-1}^s$, $F_{t-2}^s$, . . . represent partial derivatives, wave forms like sinusoids, square waves, "hat" functions, etc. and empirical orthogonal functions (EOF) depending on what is known about physical dependencies, regression and autoregression (AR) of the systematic errors of the model. Elements of estimated vector $\hat{C}_t$ will then determine amplitudes of the "red" noise factors.

Matrix $dA_t$ tells how systematic state transition errors of the dynamical (NWP) model depend on prevailing (weather) conditions. If they are unknown but vary only slowly an adjustment is done by moving averaging (MA) in conjunction with the FKF method as described next. The impact is obtained from System equation (22) and is rewritten as follows:

$$dA_t s_{t-1} =$$
$$= [s_1 I_{(m \times m)}, s_2 I_{(m \times m)}, \ldots, s_m I_{(m \times m)}] [da_{11}, da_{21}, \ldots, da_{m1}, da_{12}, \ldots, da_{mm}]'$$
$$= M_{t-1} r_t \qquad (23)$$

where $M_{t-1}$ is a matrix composed of m diagonal matrices of size m×m, $s_1, s_2, \ldots s_m$ are the m scalar elements of state vector $s_{t-1}$, $r_t$ is the column vector of all the m×m elements of matrix $dA_t$.

Please note that equation (23) reverses the order of multiplication which now makes it possible to estimate elements of matrix $dA_t$ as ordinary regression parameters.

Consequently, the following gigantic Regression Analysis problem is faced: Augmented Model for a moving time volume: (i.e. for whitening innovations sequences of residuals $e_t$ and $a_t$ for a moving sample of length L):

in the data of each time step t. Two other types are represented by vector $C_t$. The first set of these parameters is used for the whitening and the partial ortogonalization of the errors of the measurements and of the system (i.e. for block-diagonalization of the error covariance matrix). The second set, i.e. $r_t$, is used for correcting gross errors in the state transition matrices. The last two sets of parameters have more or less constant values over the long moving time window and make the Kalman filtering process an adaptive one.

It should also be noted that matrix $M_{t-1}$ cannot take its full size (m×m²) as indicated in equation (23). This is because the observability condition will become unsatisfied as there would be too many unknown quantities. Thus, matrix $M_{t-1}$ must be effectively "compressed" to represent only those elements of matrix $A_t$ which are related to serious state transition errors. Such transitions are found by e.g. using so-called maximum correlation methods. In fact, sporadic and slowly migrating patterns may develop in the space of state parameter vectors. These are small-scale phenomena, typically, and they cannot be adequately described by the state transition matrices derived from the model equations only. In order to maintain the filter stability, all the estimated elements of matrix $dA_t$ are kept observable in the moving averaging (MA) of measurements e.g. by monitoring their estimated covariances in equation (20).

The Fast Kalman Filter (FKF) formulae for a time window of length L at time point t are then as follows:

$$\hat{s}_{t-l} = \{X'_{t-l} V_{t-l}^{-1} X_{t-l}\}^{-1} X'_{t-l} V_{t-l}^{-1} (y_{t-l} - G_{t-l} \hat{c}_t) \text{ for } l = 0, 1, 2, \ldots, L-1 \qquad (25)$$

$$\hat{c}_t = \left\{ \sum_{l=0}^{L} G'_{t-l} R_{t-l} G_{t-l} \right\}^{-1} \sum_{l=0}^{L} G'_{t-l} R_{t-l} y_{t-l}$$

where, for l=0,1,2, . . . ,L−1, $$R_{t-l} = V_{t-l}^{-1} \{I - X_{t-l} \{X'_{t-l} V_{t-l}^{-1} X_{t-l}\}^{-1} X'_{t-l} V_{t-l}^{-1}\}$$

$$V_{t-l} = \begin{bmatrix} Cov(e_{t-l}) & \\ & Cov\{A_{t-l}(\hat{s}_{t-l-1} - s_{t-l-1}) - a_{t-l}\} \end{bmatrix}$$

$$y_{t-l} = \begin{bmatrix} y_{t-l} \\ A_{t-l} \hat{s}_{t-l-1} + B_{t-l} u_{t-l-1} \end{bmatrix}$$

$$X_{t-l} = \begin{bmatrix} H_{t-l} \\ I \end{bmatrix}$$

$$\begin{bmatrix} y_t \\ A\hat{s}_{t-1} + Bu_{t-1} \\ y_{t-1} \\ A\hat{s}_{t-2} + Bu_{t-2} \\ \vdots \\ y_{t-L+1} \\ A\hat{s}_{t-L} + Bu_{t-L} \\ A\hat{C}_{t-1} + Bu_{c_{t-1}} \end{bmatrix} = \begin{bmatrix} H_t & & & & F_t^y & \\ I & & & & F_t^s & M_{t-1} \\ & H_{t-1} & & & F_{t-1}^y & \\ & I & & & F_{t-1}^s & M_{t-2} \\ & & \ddots & & \vdots & \\ & & & H_{t-L+1} & F_{t-L+1}^y & \\ & & & I & F_{t-L+1}^s & M_{t-L} \\ & & & & & I \end{bmatrix} \begin{bmatrix} s_t \\ s_{t-1} \\ \vdots \\ s_{t-L+1} \\ c_t \end{bmatrix} + \begin{bmatrix} e_t \\ A(\hat{s}_{t-1} - s_{t-1}) - a_1 \\ e_{t-1} \\ A(\hat{s}_{t-2} - s_{t-2}) - a_{t-1} \\ \vdots \\ e_{t-L+1} \\ A(\hat{s}_{t-L} - s_{t-L}) - a_{t-L+1} \\ A(\hat{C}_{t-1} - C_{t-1}) - a_{c_t} \end{bmatrix}$$

Please note that the matrix equation above has a "nested" Block-Angular structure. There can be three types of different "calibration" parameters. The first type, $c_t$, is imbedded -continued $$G_{t-l} = \begin{bmatrix} F^y_{t-l} \\ \overline{F^s_{t-l} \quad M_{t-l-1}} \end{bmatrix}$$

and, i.e. for l=L, $R_{t-L} = V_{t-L}^{-1}$ $V_{t-L} = \text{Cov}\{A_c(\hat{C}_{t-1} - C_{t-1}) - a_{c_t}\}$ $y_{t-L} = A_c\hat{C}_{t-1} + B_c u_{c_{t-1}}$ $G_{t-L} = I.$ It may sometimes be necessary to Shape Filter some of the error terms for the sake of optimality. If this is done then the identity (I) matrices would disappear from the FKF formulas and have to be properly replaced accordingly.

The FKF formulas given here and in PCT/FI90/00122 and PCT/FI93/00192 are based on the assumption that error covariance matrices are block-diagonal. Attempts to solve all parameters $C_t$ with the conventional Kalman recursions from (4) to (6) doomed to fail due to serious observability and controlability problems as computational restrictions prohibit window length L from being taken long enough. Fortunately, by using the FKF formulas, the time window can be taken so long that an initialization or temporal training sequences of the filter may become completely redundant.

Various formulas for fast adaptive Kalman Filtering can derived from the Normal Equation system of the gigantic linearized regression equation (24) by different recursive uses of Frobenius' formula.

$$\begin{bmatrix} A & B \\ C & D \end{bmatrix}^{-1} = \begin{bmatrix} A^{-1} + A^{-1}BH^{-1}CA^{-1} & -A^{-1}BH^{-1} \\ -H^{-1}CA^{-1} & H^{-1} \end{bmatrix} \quad (26)$$

where $H=D-CA^{-1}B$. The formulas (20) and (25) as well as any other FKF type of formulas obtained from Frobenius' formula (26) are pursuant to the invented method.

For example, there are effective computational methods for inverting symmetric band-diagonal matrices. The error covariance matrices of numerical weather forecasts are typically band-diagonal. We can proceed directly from equation system (8) without merging state parameters s into the observational blocks of the gigantic Regression Analysis problem (18). Their error covariance matrix can then be inverted as one large block and a recursive use of Frobenius' formula leads to FKF formulas similar to formulas (25).

All the matrices to be inverted for solution of the gigantic Regression Analysis models are kept small enough by exploiting the reported semi-analytical computational methods. The preferred embodiment of the invention is shown in FIG. 1 and will be described below:

A supernavigator based on a notebook PC that performs the functions of a Kalman filtering logic unit (1) through exploiting the generalized Fast Kalman Filtering (FKF) method. The overall receiver concept comprises an integrated sensor, remote sensing, data processing and transmission system (3) of, say, a national atmospheric/oceanic service and, optionally, an off-the-shelf GPS receiver. The database unit (2) running on the notebook PC contains updated information on control (4) and performance aspects of the various subsystems as well as auxiliary information such as geographical maps. Based upon all these inputs, the logic unit (1) provides real-time 3-dimensional visualizations (5) on what is going on by using the FKF recursions for equation system (24) and on what will take place in the nearest future by using the predictions from equations (15). Dependable accuracy information is also provided when the well-known stability conditions of optimal Kalman filtering are be met by the observing system (3). These error variances and covariances are computed by using equations (15) and (20). The centralized data processing system (3) provides estimates of State Transition Matrix A for each time step t. These matrices are then adjusted locally (1) to take into account all observed small-scale transitions that occur in the atmospheric/oceanic environment (see for example Cotton, Thompson & Mielke, 1994: "Real-Time Mesoscale Prediction on Workstations", Bulletin of the American Meteorological Society, Vol. 75, Number 3, March 1994, pp. 349–362).

Those skilled in the art will appreciate that many variations could be practiced with respect to the above described invention without departing from the spirit of the invention. Therefore, it should be understood that the scope of the invention should not be considered as limited to the specific embodiment described, except in so far as the claims may specifically include such limitations.

REFERENCES (1) Kalman, R. E. (1960): "A new approach to linear filtering and prediction problems". Trans. ASME J. of Basic Eng. 82:35–45.

(2) Lange, A. A. (1982): "Multipath propagation of VLF Omega signals". IEEE PLANS '82—Position Location and Navigation Symposium Record, December 1982, 302–309.

(3) Lange, A. A. (1984): "Integration, calibration and intercomparison of windfinding devices". WMO Instruments and Observing Methods Report No. 15.

(4) Lange, A. A. (1988a): "A high-pass filter for optimum calibration of observing systems with applications". Simulation and Optimization of Large Systems, edited by A. J. Osiadacz, Oxford University Press/Clarendon Press, Oxford, 1988, 311–327.

(5) Lange, A. A. (1988b): "Determination of the radiosonde biases by using satellite radiance measurements". WMO Instruments and Observing Methods Report No. 33, 201–206.

(6) Lange, A. A. (1990): "Apparatus and method for calibrating a sensor system". International Application Published under the Patent Cooperation Treaty (PCT), World Intellectual Property Organization, International Bureau, WO 90/13794, PCT/FI90/00122, Nov. 15, 1990.

(7) Lange, A. A. (1993): "Method for Fast Kalman Filtering in large dynamic systems". International Application Published under the Patent Cooperation Treaty (PCT), World Intellectual Property Organization, International Bureau, WO 93/22625, PCT/FI93/00192, Nov. 11, 1993.

(8) Lange, A. A. (1994): "A surface-based hybrid upper-air sounding system". WMO Instruments and Observing Methods Report No. 57, 175–177.

What is claimed is:

1. A method for adjusting model and calibration parameters of a sensor system accompanied with said model of external events by adaptive Kalman filtering, the sensor output units providing signals in response to said external events and where the series of simultaneously processed sensor output signal values are longer than 50, the method comprising tne steps of:

a) providing a data base unit for storing information on:
      a plurality of test point sensor output signal values for some of said sensors and a plurality of values for said external events corresponding to said test point sensor output signal values, or simultaneous time series of said output signal values from adjacent sensors for comparison;

said sensor output signal values accompanied with values for said model and calibration parameters and values for said external events corresponding to a situation; and, controls of said sensors and changes in said external events corresponding to a new situation;

b) providing a logic unit for accessing said sensor signal output values with said model and calibration parameters, said logic unit having a two-way commnunications link to said data base unit, and computing initial values for unknown model and calibration parameters with accuracy estimates by using Lange's High-pass Filter if required;

c) providing said sensor output signal values from said sensors, as available, to said logic unit;

d) providing information on said controls and changes to said data base unit;

e) accessing current values of said model and calibration parameters and elements of a state transition matrix, and computing by using the Fast Kalman Filter (FKF) formulas obtained from Frobenius' inversion formula (26) wherein the improvement comprises a diagonalization of the error covariance matrix to be obtained by applying factors $F^y$, $F^s$ or M to Augmented Model (8), in said logic unit, updates of said model and calibration parameters, values of said external events and their accuracies corresponding to said new situation;

f) controlling stability of said Kalman filtering by monitoring said accuracy estimates, in said logic unit, and by indicating when there is need for some of the following: more sensor output signal values, test point data, sensor comparison or system reconfiguration;

g) adjusting those of said model and calibration parameter values for which stable updates are available.

* * * * *